United States Patent [19]

Wisnosky et al.

[11] 4,329,421

[45] May 11, 1982

[54] USE OF FLASHED RADIANT ENERGY IN PRODUCING RELIEF IMAGES IN RESINOUS COATING

[75] Inventors: Jerome D. Wisnosky, Lancaster, Pa.; Caroline A. Cauler, Del Rio, Tex.

[73] Assignee: Armstrong Cork Company, Lancaster, Pa.

[21] Appl. No.: 109,773

[22] Filed: Jan. 7, 1980

[51] Int. Cl.$^3$ .............................. G03C 5/00
[52] U.S. Cl. ........................ 430/322; 430/327; 430/394; 427/43.1; 427/44; 427/53.1; 427/54.1; 427/264; 427/265
[58] Field of Search ............... 430/322, 327, 394; 427/43.1, 44, 53.1, 54.1, 264, 265

[56] References Cited

U.S. PATENT DOCUMENTS

| | | | |
|---|---|---|---|
| 3,008,242 | 11/1961 | Sites et al. | 427/54.1 |
| 3,634,084 | 1/1967 | Credon et al. | 430/394 |
| 3,732,097 | 5/1973 | Dickie et al. | 437/306 |
| 3,864,143 | 2/1975 | Fantazier et al. | 264/52 |
| 3,936,530 | 2/1976 | Morgan | 427/43 |
| 3,943,046 | 3/1976 | De Sorga et al. | 427/54.1 |
| 3,949,028 | 4/1976 | Morakami et al. | 264/22 |
| 4,138,299 | 2/1979 | Bolgiano | 427/54.1 |
| 4,150,169 | 4/1979 | Bagley et al. | 427/54.1 |
| 4,165,265 | 8/1979 | Nakabayashi et al. | 427/54.1 |

*Primary Examiner*—Jack P. Brammer

[57] ABSTRACT

This invention pertains to a method and apparatus for developing a relief image in a resinous coating on the surface of a substrate. In a preferred embodiment, this invention pertains to a flooring material having a decorative visual image and a cured wear layer coating superimposed over the visual image, the cured wear layer coating having a relief image developed therein which image is in register with the decorative visual image on the flooring material.

18 Claims, 2 Drawing Figures

GRAPHIC REPRESENTATION
OF THE DATA OF TABLE I

USE OF FLASHED RADIANT ENERGY IN PRODUCING RELIEF IMAGES IN RESINOUS COATING

This invention relates to resinous coating compositions which are curable by radiant energy and to resinous coating compostions which are curable by a combined radiant energy and moisture cure.

More specifically, this invention relates to a method and apparatus for developing a relief image in a resinous coating superimposed on the surface of a substrate.

In one of its more specific aspects, this invention pertains to a method and apparatus for developing a relief image in a resinous coating on the surface of a substrate, the relief image capable of being developed in register with a decorative visual image on the substrate surface. For example, a flooring material having a decorative visual image (generally, a printed design) and a cured wear layer superimposed over the visual image. The cured wear layer having a relief image in register with the decorative visual image.

The resilient flooring industry, the sheet metal fabrication industry and the furniture industry are among the many industries continually searching for new methods for texturing the wear resistant coatings or films applied to various products. For example, it is well known in the resilient flooring industry that an embossed wear resistant coating, in addition to being aesthetically pleasing, also serves to provide improvement in flooring wear performance.

One method presently employed in the resilient flooring industry to emboss wear resistant coated sheet type flooring is to pass the flooring in contact with mechanical embossing rolls as taught in U.S. Pat. Nos. 3,741,851 and 4,076,867. One advantage of the present invention is that it facilitates the production of embossed resilient flooring without the use of mechanical embossing rolls.

According to this invention there is provided a method for developing a relief image in a resinous coating composition curable by radiant energy which method comprises:

(a) coating the surface of a substrate with the resinous coating composition;

(b) exposing, using a flash exposure mode, a portion of the surface of the coating to a dosage of radiant energy effective to at least partially polymerize the exposed portion, the flash exposure mode consisting of flashes of radiant energy impinging the exposed portion of the coating surface, the number of flashes, the flash duration and the radiant flux density of the flashes serving to increase the amount of relief developed in the coating as compared to the amount of relief developed by exposing the portion of the surface of the coating to the same amount of radiant energy using a continuous exposure mode; and, (c) exposing the partially polymerized coating to a dosage of radiant energy effective to complete the polymerization of the coating whereby the resulting cured coating exhibits a relief image.

According to this invention there is also provided a method for developing a relief image in a resinous coating composition curable by a combined radiant energy and moisture cure which method comprises:

(a) coating the surface of a substrate with the resinous coating composition;

(b) exposing, using a flash exposure mode, a portion of the surface of the coating to a dosage of radiant energy effective to at least partially polymerize the exposed poriton, the flash exposure mode consisting of flashes of radiant energy impinging on the exposed portion of the coating surface, the number of flashes, the flash duration, and the radiant flux density of the flashes serving to increase the amount of relief developed in the coating as compared to the amount of relief developed by exposing the portion of the surface of the coating to the same amount of radiant energy using a continuous exposure mode;

(c) exposing the partially polymerized coating to a dosage of radiant energy effective to complete the polymerization of the radiant energy curable components of the coating; and, (d) subjecting the resulting radiant energy cured coating to a moisture cure to fully cure the coating whereby the resulting cured coating exhibits a relief image.

Also, according to this invention there is provided apparatus for developing a relief image in a resinous coating composition which is curable by radiant energy or curable by a combined radiant energy and moisture cure which apparatus comprises:

(a) means for coating the surface of a substrate with the resinous coating composition;

(b) means for impinging a portion of the surface of the coating with a plurality of flashes of radiant energy to at least partially polymerize the exposed portion of the coating; and, (c) further means for fully curing the coating; the means for impinging in step (b) and the means for fully curing in step (c) serving to develop a relief image in the coating.

In a preferred embodiment the resinous coating composition will contain a free radical generating catalyst and is curable by ultraviolet radiation.

When used herein, the terms quoted below will have the meanings ascribed to them.

"Radiant energy" means energy in the form of electromagnetic waves. The unit symbol for radiant energy is (J).

"Radiant exposure" means the amount of radiant energy transferred per unit of surface area. The unit symbol for radiant exposure is (J cm$^{-2}$).

"Radiant power or flux" means the rate of transfer of radiant energy per unit of time. The unit symbol for radiant power or flux is (J s$^{-1}$) or (W).

"Radiant flux density" means the radiant power or flux per unit of surface area. The unit symbol for radiant flux density is (W cm$^{-2}$).

"Flash" means a sudden brief burst of radiant energy. And, "flash duration" means the continuance in time of each flash.

Using the above definitions the radiant exposure transferred to the surface of a coating can be determined, in a continuous exposure mode, by the formula:

$$\text{radiant exposure} = [\text{radiant flux density}] [\text{exposure time}] \quad (\text{I})$$
$$(J\,cm^{-2}) \qquad (W\,cm^{-2}) \qquad (\text{seconds})$$

and, in a flash exposure mode by the formula:

$$\begin{array}{c}\text{Radiant} = \text{Radiant} \\ \text{Exposure} \quad \text{Flux} \quad \text{Number of} \quad \text{Flash Duration} \\ (J\,cm^{-2}) \quad \text{Density} \quad \text{Flashes} \quad (\text{seconds}) \\ (W\,cm^{-2}) \end{array} \quad (\text{II})$$

"Relief" means the difference in level between the highest and lowest portions of the fully cured coating. The relief developed according to this invention can be raised relief or sunken relief depending on whether a positive or negative mask is employed.

The coating compositions suitable for use in this invention are applied in liquid form and are broadly classified as resinous coating compositions curable by either radiant energy or by a combined radiant energy and moisture cure.

Suitable resinous coating compositions curable by radiant energy include free radical initiated ethylenically unsaturated polymerizable compositions, free radical initiated polyene-polythiol polymerizable compositions, cationic initiated epoxy polymerizable compositions, and the like.

Also suitable for use are resinous compositions curable by a combined radiant energy cure and a moisture cure such as the liquid coating compositions taught in U.S. Pat. No. 4,138,299 to N. C. Bolgiano. The present invention, using a coating produced according to U.S. Pat. No. 4,138,299 having about a 40% radiant energy curable content and a 60% moisture curable content, is demonstrated herein in Example VIII. If a combined radiant energy and moisture curable resinous coating composition is employed in the practice of this invention, it will contain at least a 5% radiant energy curable content. Preferably, 30 to about 40% of the coating composition will be curable by radiant energy.

The coating compositions can also contain conventional amounts of art recognized ingredients such as, for example, heat and light stabilizers, fillers, pigments, and the like.

The subject invention will be more easily understood if explained in conjunction with the attached drawing in which.

Figure 2:
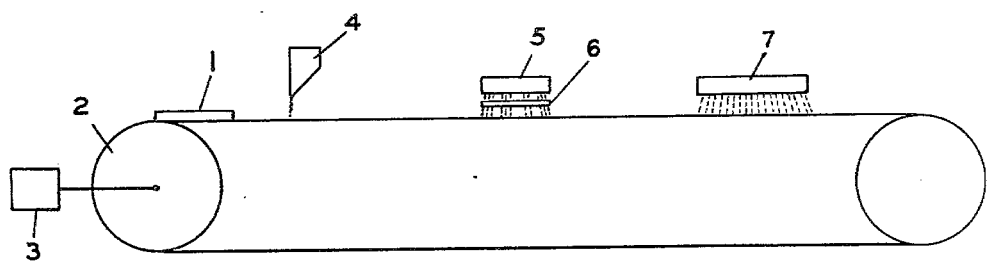
FIG. 2 is a schematic of the apparatus for carrying out the subject invention.

Referring now to FIG. 2, there is shown material to be coated 1, carried on means for moving 2, driven by drive means 3.

The material to be coated, after passing under means for coating 4, where a resinous composition in liquid form is applied, is passed under flash irradiating means 5 equipped with radiant energy mask means 6 and flash irradiated with a dosage of radiant energy effective to at least partially cure, that is, polymerize the irradiated portion of the coating. From the flash irradiating means, the material passes under curing means 7 where the coating composition is fully cured.

In the best mode for practicing this invention, the above described apparatus operates as follows:

As the material to be coated, in this instance a commercial vinyl asbestos floor tile to be wear layer coated is fed along the means for moving 2, which can be any conventional conveyor system, it is first conveyed under a conventional curtain applicator 4 where a liquid resinous composition curable by ultraviolet radiation is applied to a thickness of about 15 mils. Rather than a curtain applicator, other conventional coating applicators, such as a roll coater, blade coater, spray coater, extrusion coater, screen printer, offset printer, and the like, can be employed to apply the coating compositions to thicknesses within the range of from about 0.5 mil to any desired thickness.

Tile 1, having an uncured liquid ultraviolet radiation curable resinous coating on its surface, is now conveyed under flash irradiator 5, in this instance, an ultraviolet light source equipped with a conventional electromagnetic shutter, where flashes of ultraviolet radiation are directed down through mask means 6, which is a metal mask, positioned between the light source and the coating surface. The metal mask has solid or closed areas which prevent passage of the ultraviolet radiation and open areas which allow the ultraviolet radiation to pass through and impinge the unmasked portions of the coating surface. A particularly suitable ultraviolet light source is a 500 watt, high pressure, point-source mercury light system designated "Oriel Light Source system" commercially available from Oriel Corporation of America, Stamford, Conn. Alternatively, instead of equipping an ultraviolet light source with a shutter, a conventional flash irradiating system can be employed. One particularly suitable system is designated "RC-4000" Rapid Cure Flash Polymerization System, commercially available from Xenon Corporation, Wilmington, Massachusetts.

Rather than using ultraviolet radiation any other type of radiant energy can be employed; for example, an electron beam, gamma rays, visible light rays and the like, provided however, that the liquid radiant energy curable resinous composition is formulated to cure when exposed to the selected type of radiant energy. For example, if visible light rays are used as the radiant energy, the composition will include a visible light-sensitive photoinitiator.

If a mask means is employed to provide for selective impingement of radiant energy it can be, for example, a metal mask, a film transparency, or an image from a projection system suitable to attenuate or block out a portion of the type of radiant energy used. Multiple level relief images in coatings can be achieved by attenuating the radiant energy through a film of different optical densities ranging from transparent to black. The mask can be either a stationary mask in which case the tile would have to be held momentarily under the radiant energy source or, alternatively, the mask can be movable such that the tile does not have to be momentarily held under the radiant energy source. The mask can be placed in contact with the coating surface. Preferably, the mask is positioned a distance above the coating surface.

As an alternative to using (1) a mask and a shutter in combination with the radiant energy source or (2) a mask in combination with a flash irradiating system to selectively cure and flash irradiate a portion of the coating, the radiant energy from a laser, preferably equipped with a movable mirror and programmed to selectively scan a portion of the coating surface could be employed. The movement of the laser over the uncured coating surface could be timed such that the repositioning of the laser beam occurs during the off cycle of the laser flashes. The use of a laser would serve to eliminate the need for both a mask and a shutter.

Tile 1 is then conveyed from the flash irradiating means 5 under curing means 7 which could be a bank of ultraviolet lights or the initial irradiator with the mask and shutter removed or any other suitable radiant energy source directing sufficient radiation on the coating composition to complete the polymerization of the coating. If the liquid resinous coating composition is curable by a combined radiant energy and moisture cure, curing means 7 will be followed by a moisture cure which can consist of allowing the coating to age at room conditions as taught in U.S. Pat No. 4,138,299.

The resulting cured coating on the tile will exhibit a relief image in register with the mask means employed in the flash irradiating step above. Accordingly, if the mask is designed in register with a decorative visual image on the tile, the relief image developed through the mask on the cured wear layer will be in register with that decorative visual image.

Having described the method and apparatus of this invention reference is now made to the following examples which further illustrate the invention.

EXAMPLE I

This example demonstrates the preparation of a free radical initiated ethylenically unsaturated polymerizable composition used to produce the data set forth in Tables I, II, III, and IV below.

About 21.9 weight percent of 4,4′diisocyanato dicyclohexylmethane, about 0.05 weight percent 2,6-ditert-butyl-4-methylphenol, about 0.2 weight percent 2-ethylhexylacrylate, and about 0.1 weight percent of dibutyltin dilaurate catalyst were introduced into a reaction vessel with agitation.

About 7.2 weight percent 2-ethylhexylacrylate was introduced into the reaction vessel with agitation.

The contents of the reaction vessel were agitated for about 10 minutes and about 6.8 weight percent 2-hydroxyethylacrylate was added to the contents of the reaction vessel at a rate of about 16 pounds per minute and the temperature in the reaction vessel was not allowed to exceed 130° F.

About 2.2 weight percent 2-ethylhexylacrylate was introduced into the reaction vessel and the temperature of the reaction vessel was held at 130° F. For about one hour.

The reactor was cooled to about 120° F. and about 17.7 weight percent of the reaction product of 1 mole glycerol, 3 moles of a 7/3 mixture of adipic acid and isophthalic acid and 3 moles of 1,6 hexanediol MW 960; Hydroxyl No. 175 (Hooker Chemical Triol F-2039-180) was rapidly added to the reactor contents. The temperature in the reaction vessel was not allowed to exceed 140° F.

Next, about 16.6 weight percent of a polycaprolactone diol having an MW of 540 and a Hydroxyl No. of 207 (Union Carbide PCP-0200 diol) was added to the contents of the reaction vessel and the temperature of the vessel was cooled to about 140° F.

About 2.2 weight percent 2-ethylhexylacrylate was added to the reaction vessel and the temperature of the vessel was held at about 140° F. for about four hours.

The temperature of the reaction vessel was cooled to about 90-100° F. and about 6.7 weight percent acrylic acid added to the reaction vessel.

Into a mix tank were added about 2 weight percent benzophenone, about 0.1 weight percent glycol polysiloxane (Dow Corning DC-193), and about 2.2 weight percent 2-ethylhexylacrylate with agitation.

The contents of the mix tank were added to the reaction vessel.

About 1.0 weight percent of benzoinisobutylether were added to the reaction vessel followed by about 2.2 weight percent 2-ethylexylacrylate.

The contents of the reaction vessel were agitated to insure complete dispersion of all ingredients and the resulting product was recovered as a free radical initiated ethylenically unsaturated polymerizable liquid coating composition suitable for use in the practice of this invention.

EXAMPLE II

Fifty-four 2″×3″50 mil thick clear glass micro slides were coated, using a draw down bar, with the coating composition of Example I, each to a coating thickness of 15 mils.

Twenty-one of the coated slide samples were individually placed under a partially masked Oriel Light Source System, described above, equipped with an electromagnetic shutter. And, each coated sample was flash irradiated (with the exception of the six control samples) in a nitrogen atmosphere, at room temperature and at a radiant flux density of 0.09 watts per square centimeter. The duration between flashes was held constant at one second. The mask was positioned about 1/16 inch above the coated sample and about 17 inches beneath the light source. At each radiant exposure level, a control sample was prepared by using continuous rather than flash irradiating, that is, one continuous flash sufficient to impart the desired radiant exposure was employed.

Each coated sample was than placed under a conventional ultraviolet light source and the entire surface of the coating impinged with a dosage of UV light sufficient to complete the polymerization of the coating. The samples were then subjected to profilometer testing to determine the amount of relief developed in each cured coating.

The test conditions and the amount relief developed after full cure are set forth in Table I.

TABLE I

Relief Developed Using Flash Exposure Mode compared to Continuous Exposure Mode (Control) in the Coating Composition of Example I at a Radiant Flux Density of 0.09 W cm$^{-2}$

| Sample | Radiant Exposure (J.cm$^{-2}$) | Flash Duration (seconds) | No. of Flashes | Relief Developed (mils) |
| --- | --- | --- | --- | --- |
| 1 | 0.009 | 0.005 | 20 | 2.0 |
| 1A | 0.009 | 0.05 | 2 | 0 |
| 1 Control | 0.009 | 0.1 | continuous | 0 |
| 2 | 0.023 | 0.005 | 50 | 4.0 |
| 2A | 0.026 | 0.05 | 6 | 0.5 |
| 2B | 0.026 | 0.1 | 3 | 0.25 |
| 2 Control | 0.026 | 0.3 | continuous | 0.10 |
| 3 | 0.043 | 0.005 | 100 | 5.0 |
| 3A | 0.045 | 0.05 | 10 | 3.80 |
| 3B | 0.045 | 0.1 | 5 | 2.80 |
| 3 Control | 0.045 | 0.5 | continuous | 1.30 |
| 4 | 0.09 | 0.05 | 20 | 3.80 |
| 4A | 0.09 | 0.1 | 10 | 3.00 |
| 4B | 0.09 | 0.5 | 2 | 1.75 |
| 4 Control | 0.09 | 1.0 | continuous | 1.25 |
| 5 | 0.45 | 0.5 | 10 | 2.60 |
| 5A | 0.45 | 1.0 | 5 | 2.25 |
| 5 Control | 0.45 | 5.0 | continuous | 1.60 |
| 6 | 0.9 | 0.5 | 20 | 2.60 |
| 6A | 0.9 | 1.0 | 10 | 2.10 |
| 6 Control | 0.9 | 10.0 | continuous | 1.0 |

Figure 1:
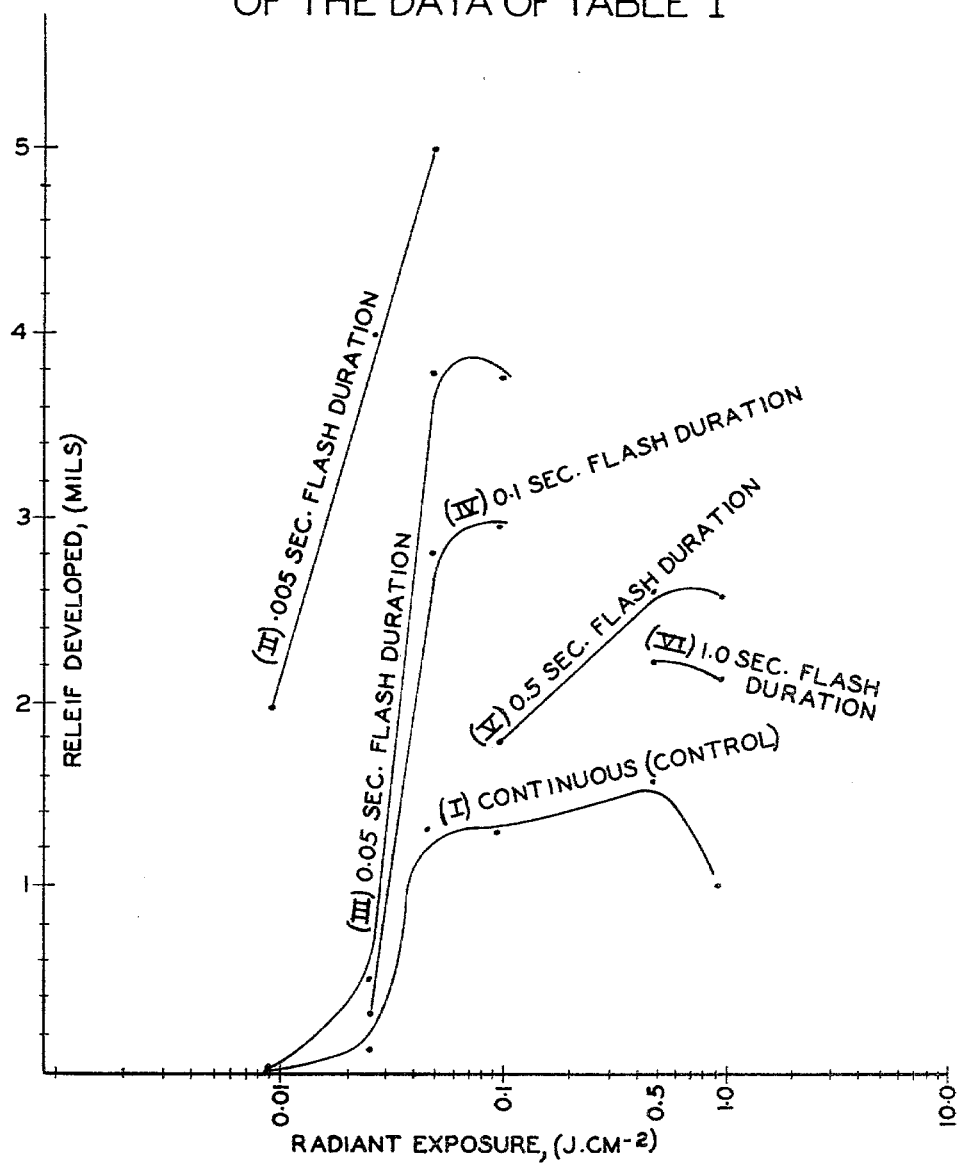
FIG. 1 is a graphic representation of the data of Table I.

It will be seen from FIG. 1, which is a graphic representation of the data of Table I, that the use of a flash exposure mode to at least partially polymerize a portion of the liquid coating composition provides cured coatings having increased amounts of relief as compared to the control samples.

Curve (I) (Control) is included to establish a base curve; Curve (I) is according to the prior art (U.S. Pat. No. 3,732,097) and establishes the relief obtained when a flash exposure mode is not employed. Curve (I) is not according to the method of this invention.

Curves (II–VI) demonstrate the relief obtained, at flash durations of from about 0.005 to about 1.0 seconds, using a flash exposure mode according to the method of this invention. Curves (II–VI) all demonstrate that the subject invention provides cured coating having increased amounts of relief as compared to the prior art.

EXAMPLE III

Twenty-five of the coated samples prepared in Example II were flash irradiated (with the exception of the six control samples) according to the method of Example II. The radiant flux density was 0.03 watts per square centimeter, and the duration between flashes was held constant at one second.

The test conditions and relief developed after full cure are set forth in Table II.

TABLE II

Relief Developed Using Flash Exposure Mode Compared to Continuous Exposure Mode (Control) in the Coating Composition of Example I at a Radiant Flux Density of 0.03 W cm$^{-2}$

| Sample | Radiant Exposure (J cm$^{-2}$) | Flash Duration (seconds) | No. of Flashes | Relief Developed (mils) |
|---|---|---|---|---|
| 7 | 0.0307 | 0.05 | 20 | * |
| 7A | 0.0307 | 0.1 | 10 | 2.25 |
| 7B | 0.0307 | 0.5 | 2 | 1.5 |
| 7 Control | 0.0307 | 1.0 | continuous | 1.5 |
| 8 | 0.0491 | 0.05 | 32 | * |
| 8A | 0.0491 | 0.1 | 16 | 5.25 |
| 8C | 0.0491 | 0.5 | 3 | 2.75 |
| 9 | 0.0616 | 0.1 | 20 | 6.0 |
| 9A | 0.0616 | 0.5 | 4 | 3.25 |
| 9B | 0.0614 | 1.0 | 2 | 2.75 |
| 9 Control | 0.0614 | 2.0 | continuous | 2.75 |
| 10 | 0.0982 | 0.1 | 32 | 5.0 |
| 10A | 0.0924 | 0.5 | 6 | 3.25 |
| 10B | 0.0921 | 1.0 | 3 | 2.75 |
| 11 | 0.154 | 0.5 | 10 | 3.25 |
| 11A | 0.154 | 1.0 | 5 | 2.75 |
| 11 Control | 0.154 | 5.0 | continuous | 2.0 |
| 12 | 0.308 | 0.5 | 20 | 3.25 |
| 12A | 0.307 | 1.0 | 10 | 3.0 |
| 12 Control | 0.307 | 10.0 | continuous | 2.0 |
| 13 | 0.493 | 0.5 | 32 | 3.25 |
| 13A | 0.491 | 1.0 | 16 | 3.25 |
| 13 Control | 0.507 | 16.5 | continuous | 2.5 |
| 14 | 0.982 | 1.0 | 32 | 3.25 |
| 14 Control | 1.013 | 33.0 | continuous | 2.0 |

*No relief developed

EXAMPLE IV

Four of the coated samples prepared in Example II were flash irradiated (except for the control) according to the method of Example II with the exception that the flash irradiating was done in air, rather than a nitrogen atmosphere. The radiant flux density was 0.09 watts per square centimeter and the duration between flashes was one second.

The test conditions and relief developed after full cure are set forth in Table III.

TABLE III

Relief Developed Using Flash Exposure Mode compared to Continuous Exposure Mode (Control) in the Coating Composition of Example I at a Radiant Flux Density of 0.09 W cm$^{-2}$ in an Air Atmosphere

| Sample | Radiant Exposure (J cm$^{-2}$) | Flash Duration (seconds) | No. of Flashes | Relief Developed (mils) |
|---|---|---|---|---|
| 15 | 0.091 | 0.05 | 20 | * |
| 15A | 0.091 | 0.1 | 10 | 1.5 |
| 15B | 0.091 | 0.5 | 2 | 0.75 |
| 15 Control | 0.091 | 1.0 | continuous | 0.5 |

*No relief developed

It will seem from the above data in Tables I, II and III that the use of a flash exposure mode to at least partially polymerize a portion of the free radical initiated ethylenically unsaturated polymerizable coating of Example I serves to facilitate the production of fully cured coatings which exhibit increased amounts of relief as compared to fully cured coating produced according to the prior art, that is, cured coatings produced using a continuous two-step (masked and unmasked) exposure. See U.S. Pat. No. 3,732,097. It will also be noted that the increase in relief provided according to this invention is obtainable in an air atmosphere as well as in an inert atmosphere.

EXAMPLE V

Four of the coated samples prepared in Example II were flash irradiated (except for the control) according to the method of Example II with the exception that in Samples 16, 16A and 16B, the duration between flashes were 10, 1 and 0.44 seconds, respectively. The radiant flux density was 0.035 watts per square centimeter.

The test conditions and relief developed after full cure are set forth in Table IV.

TABLE IV

Relief Developed Using Flash Exposure Mode Compared to Continuous Exposure Mode (Control) in the Coating Composition of Example I at a Radiant Flux Density of 0.035 W cm$^{-2}$ Using Different Duration Times Between Flashes

| Sample | Radiant Exposure (J cm$^{-2}$) | Flash Duration (seconds) | No. of Flashes | Duration, Time Between Flashes (seconds) | Relief Developed (mils) |
|---|---|---|---|---|---|
| 16 | 0.035 | 0.1 | 10 | 10 | 3.75 |
| 16A | 0.035 | 0.1 | 10 | 1 | 3.50 |
| 16B | 0.035 | 0.1 | 10 | 0.44 | 4.75 |
| 16 Control | 0.035 | 1.0 | continuous | | 2.50 |

The above data indicate that varying the duration between flashes does have an effect on the relief obtained, and that at all three: 10, 1 and 0.44 second durations between flashes, increased relief was obtained as compared to the control sample. The above data indicates that faster flashing results in increased relief; as the flash rate increases at some point, it may be perceived by the coating to be essentially continuous irradiation and, accordingly, it is believed that the relief achieved will fall off and approach the amount of relief achieved with continuous irradiating.

EXAMPLE VI

This example demonstrates the method of this invention using a liquid free radical initiated polyene-polythiol polymerizable coating composition curable by radiant energy.

Two 2"×3" 50 mil thick clear glass micro slides were coated, using a draw down bar, with the polyene-polythiol coating composition taught in Example I of U.S. Pat. No. 4,150,169, each to a coating thickness of 15 mils.

One coated slide sample (17) was flash irradiated according to the procedure of Example II. The duration between flashes was one second.

The other coated sample (17 Control) was not flash irradiated but subjected to continuous irradiating.

The test conditions and relief developed are set forth in Table V.

TABLE V

Relief Developed Using Flash Exposure Mode Compared to Continuous Exposure Mode (Control) in a Polyene-Polythiol Coating Composition at a Radiant Flux Density of 0.036 W cm$^{-2}$

| Sample | Radiant Exposure (J cm$^{-2}$) | Flash Duration (seconds) | No. of Flashes | Relief Developed (mils) |
|---|---|---|---|---|
| 17 | 0.036 | 0.1 | 10 | 0.48 |
| 17 Control | 0.036 | 1.0 | continuous | 0.25 |

The above data indicate that the subject invention facilitates the development of increased relief in free radical initiated polyene-polythiol polymerizable coatings.

EXAMPLE VII

This example demonstrates the method of this invention using a liquid cationic initiated epoxy polymerizable coating composition curable by radiant energy.

Two 2"×3" 50 mil thick clear glass micro slides were coated, using a draw down bar, with a liquid cationic initiated epoxy polymerizable radiant energy curable coating composition, each to a coating thickness of 15 mils. The coating composition contained 44 weight percent epoxy resin designated "EPON ® Resin 828" commercially available from Shell Chemical Co., 55 weight percent of a bi-functional glycidyl ether designated "Heloxy MK-107" commercially available from Wilmington Chemical Corp., and 3 weight percent of diphenyl iodonium hexafluorophosphate photoinitiator.

One coated slide sample (18) was flash irradiated according to the procedure of Example II. The duration between flashes was one second.

The other coated sample (18 Control) was not flash irradiated but subjected to continuous irradiating.

The test conditions and relief developed are set forth in Table V.

TABLE V

Relief Developed Using Flash Exposure Mode Compared to Continuous Exposure Mode (Control) in an Epoxy Polymerizable Liquid Coating Composition at a Radiant Flux Density of 0.110 W cm$^{-2}$

| Sample | Radiant Exposure (J cm$^{-2}$) | Flash Duration (seconds) | No. of Flashes | Relief Developed (mils) |
|---|---|---|---|---|
| 18 | 2.2 | 1.0 | 20 | 8.50 |
| 18 Control | 2.2 | 20.0 | continuous | 4.25 |

The above data indicate that the subject invention facilitates the development of increased relief in cationic initiated epoxy polymerizable coatings.

EXAMPLE VIII

This example demonstrates the method of this invention using a liquid acrylic cross-linking monomer coating composition curable by radiant energy.

Two 2"×3" 50 mil thick clear glass micro slides were coated, each to a thickness of 15 mils using a draw down bar, with a liquid acrylic cross-linking monomer coating composition, which is a free radical initiated ethylenically unsaturated polymerizable composition, comprising 99 weight percent "SR 295" acrylic cross-linking monomer and 1 weight percent diethoxyacetophenone. SR 295 is pentaerythritol tetraacrylate and is commercially available from Sartomer.

One coated slide sample (19) was flash irradiated according to the procedure of Example II. The duration between flashes was one second.

The other coated sample (19 Control) was not flash irradiated but subjected to continuous irradiating.

The test conditions and relief developed are set forth in Table VI.

TABLE VI

| Sample | Radiant Exposure (J cm$^{-2}$) | Flash Duration (seconds) | No. of Flashes | Relief Developed (mils) |
|---|---|---|---|---|
| 19 | 1.1 | 1 | 10 | 3.25 |
| 19 Control | 1.1 | 10 | 1 | 2.5 |

The above data indicate that the subject invention facilitates the development of increased relief images in acrylic cross-linking monomer polymerizable coatings.

EXAMPLE IX

This example demonstrates the method of this invention using a free radical irradiated ethylenically unsaturated polymerizable coating composition curable by a combined radiant energy and moisture cure.

Three 2"×3" 50 mil thick clear glass micro slides were coated each to a thickness of 15 mils using a draw down bar with the liquid radiant energy and moisture curable coating composition of Example I of U.S. Pat. No. 4,138,299.

One coated sample (20) was flash irradiated according to the procedure of Example II. The duration between flashes was one second. After flash irradiating the mask was removed and the radiant energy curable content of the coating was UV cured.

Two coated samples (20 Control and A and B) were not flash irradiated but subjected to continuous irradiating followed by removing the mask and completing the polymerization of the radiant energy curable content of the coating.

All three coatings were subjected to a moisture cure comprising allowing the coatings to fully cure by aging at room temperature for about three weeks.

The test conditions and relief developed are set forth in Table VII.

TABLE VII

Relief Developed Using Flash Exposure Mode Compared to Continuous Exposure Mode (Control) in Composition of U.S. Pat. No. 4,138,299 at a Radiant Flux Density of 0.036 W cm$^{-2}$

| Sample | Radiant Exposure (J cm$^{-2}$) | Flash Duration (seconds) | No. of Flashes | Relief Developed (mils) |
|---|---|---|---|---|
| 20 | 0.09 | 0.1 | 25 | 1.25 |
| 20 Control A | 0.36 | 10.0 | continuous | 1.0 |

TABLE VII-continued

Relief Developed Using Flash Exposure Mode Compared to Continuous Exposure Mode (Control) in Composition of U.S. Pat. No. 4,138,299 at a Radiant Flux Density of 0.036 W cm$^{-2}$

| Sample | Radiant Exposure (J cm$^{-2}$) | Flash Duration (seconds) | No. of Flashes | Relief Developed (mils) |
|---|---|---|---|---|
| 20 Control B | 0.036 | 1.0 | continuous | 0.25 |

The above data indicate that the subject invention facilitates the development of increased relief in liquid coatings curable by a combined radiant energy and moisture cure.

EXAMPLE X

A vinyl asbestos floor tile printed with a decorative visual image was coated with the coating composition of Example II to a coating thickness of 15 mils using a draw down bar.

A film-transparency mask was prepared which mask was in register with the decorative visual image on the floor tile. The mask was positioned between the floor tile and the UV light source, equipped with an electromagnetic shutter described above. The mask was about 5/16 inch above the floor tile, about 10 inches beneath the light source and was positioned in-register with the decorative visual image.

The coated floor tile was flash irradiated through the mask at a radiant flux density of 0.032 W cm$^{-2}$ to a radiant exposure of 0.32 J cm$^{-2}$ (flash duration=1.0 seconds, No. of flashes=10, duration between flashes=1.0 seconds).

The resulting partially cured coating on the floor tile was then fully cured by placing the floor tile under an ultraviolet light for about 2 minutes.

The resulting floor tile was observed to possess relief or embossing in register with the decorative visual image. Profilometer testing indicated an average relief or embossing depth of 1.9 mils as compared to an average relief of 1.2 mils achieved on a control vinyl asbestos floor tile prepared in the same manner but irradiated using continuous rather than flash radiation (radiant flux density 0.32 W cm$^{-2}$; radiant exposure 0.32 J cm$^{-2}$).

The above data indicates that the floor tile irradiated according to this invention demonstrated a 58% increase in the amount of relief obtained.

In addition to glass and vinyl asbestos tile PVC foams substrates of various densities were coated with radiant energy curable resinous compositions and flash irradiated according to the method of this invention. All exhibited increased relief as compared to control samples.

It will be evident from the foregoing that various modifications can be made to this invention. Such, however, are considered to be within the scope of this invention.

What is claimed is:

1. A method for developing a relief image in a resinous coating composition which is curable by radiant energy which method comprises
   (a) coating the surface of a substrate with the resinous coating composition;
   (b) exposing, using a flashed radiant energy mode, a portion of the surface of the coating to a dosage of radiant energy effective to at least partially polymerize those areas of the coating that are impinged by the flashed radiation, leaving those areas of the coating that are not impinged by the flashed radiant energy unpolymerized, the flashed radiant energy consisting of flashes of radiant energy impinging the exposed portion of the coating surface, the number of flashes, the flash duration, and the radiant flux density of the flashes serving to increase the amount of relief developed in the coating as compared to the amount of relief developed by exposing the portion of the surface of the coating to the same amount of radiant energy using a continuous radiant energy exposure mode; and,
   (c) exposing the entire coating to a dosage of radiant energy effective to completely polymerize the entire coating whereby the resulting coating exhibits a relief image.

2. The method of claim 1 in which said resinous coating composition is a free radical initiated ethylenically unsaturated polymerizable coating composition fully curable by radiant energy.

3. The method of claim 1 in which said resinous coating composition is a free radical initiated polyene-polythiol polymerizable coating composition fully curable by radiant energy.

4. The method of claim 1 in which said resinous coating composition is a cationic initiated epoxy polymerizable coating composition fully curable by radiant energy.

5. The method of claim 1 in which said radiant energy is ultraviolet radiation.

6. The method of claim 1 in which said radiant energy is visible light rays.

7. The method of claim 1 in which said radiant energy is an electron beam.

8. A method for developing a relief image in a resinous coating composition which is curable by a combined radiant energy and moisture cure which method comprises:
   (a) coating the surface of a substrate with the resinous coating composition;
   (b) exposing, using a flashed radiant energy mode, a portion of the surface of the coating to a dosage of radiant energy effective to at least partially polymerize those areas of the coating that are impinged by the flashed radiation, leaving those areas of the coating that are not impinged by the flashed radiation unpolymerized, the flashed radiant energy exposure mode consisting of flashes of radiant energy impinging on the exposed portion of the coating surface, the number of flashes, the flash duration, and the radiant flux density of the flashes serving to increase the amount of relief developed in the coating as compared to the amount of relief developed by exposing the portion of the surface of the coating to the same amount of radiant energy using a continuous radiant energy exposure mode;
   (c) exposing the entire coating to a dosage of radiant energy effective to completely polymerize the radiant energy curable components of the coating; and
   (d) subjecting the resulting radiant energy cured coating to a moisture cure to fully cure the coating whereby the resulting coating exhibits a relief image.

9. The method of claim 8 in which the resinous coating composition is a free radical initiated ethylenically unsaturated polymerizable coating composition curable by a combined radiant energy and moisture cure.

10. The method of claim 8 in which the radiant energy in steps (b) and (c) is ultraviolet radiation and the moisture cure in step (d) consists of allowing the coating to age at room conditions.

11. A method for developing a relief image in a liquid resinous wear layer coating on a flooring material having a decorative visual image which coating is curable by radiant energy comprising:
- (a) exposing, using a flashed radiant energy mode, a portion of the surface of the coating to a dosage of radiant energy effective to at least partially polymerize those areas of the coating that are impinged by the flashed radiation, leaving those areas of the coating that are not impinged by the flashed radiant energy unpolymerized, the flashed radiant energy exposure mode consisting of flashes of radiant energy impinging the exposed portion of the coating surface, the number of flashes, the flash duration, and the radiant flux density of the flashes serving to increase the amount of relief developed in the coating as compared to the amount of relief developed by exposing the portion of the surface of the coating to the same amount of radiant energy using a continuous radiant energy exposure mode; and,
- (c) exposing the entire coating to a dosage of radiant energy effective to completely polymerize the entire coating whereby the resulting coating exhibits a relief image.

12. The method of claim 11 in which the relief image developed in the wear layer coating is in register with the decorative visual image on the flooring material.

13. A method for developing a relief image in a liquid resinous wear layer coating on a flooring material having a decorative visual image which coating is curable by a combined radiant energy and moisture cure comprising:
- (a) exposing, using a flashed radiant energy mode, a portion of the surface of the coating to a dosage of radiant energy effective to at least partially polymerize those areas of the coating that are impinged by the flashed radiation, leaving those areas of the coating that are not impinged by the flashed radiation unpolymerized, the flashed radiant energy exposure mode consisting of flashes of radiant energy impinging the exposed portion of the coating surface, the number of flashes, the flash duration, and the radiant flux density of the flashes serving to increase the amount of relief developed in the coating as compared to the amount of relief developed by exposing the portion of the surface of the coating to the same amount of radiant energy using a continuous radiant energy exposure mode;
- (b) exposing the entire coating surface to a dosage of radiant energy effective to completely polymerize the radiant energy curable component of said coating; and
- (c) subjecting the resulting radiant energy cured coating to a moisture cure to fully cure the coating whereby the resulting wear layer coating exhibits a relief image.

14. The method of claim 13 in which the relief image developed in the wear layer coating is in register with the decorative visual image on the flooring material.

15. A flooring material having a decorative visual image and a cured wear layer coating superimposed over the visual image, the cured wear layer coating having a relief image produced according to the method of claim 1.

16. The flooring material of claim 15 in which the relief image in the cured wear layer coating is in register with the decorative visual image on the flooring material.

17. A flooring material having a decorative visual image and a cured wear layer coating superimposed over the visual image, the cured wear layer coating having a relief image produced according to the method of claim 8.

18. The flooring material of claim 17 in which the relief image in the cured wear layer coating is in register with the decorative visual image on the flooring material.

* * * * *